(12) United States Patent
Creedon et al.

(10) Patent No.: US 6,718,411 B2
(45) Date of Patent: Apr. 6, 2004

(54) ASIC SYSTEM ARCHITECTURE INCLUDING DATA AGGREGATION TECHNIQUE

(75) Inventors: Tadhg Creedon, Furbo (IE); Vincent Gavin, Galway (IE); Denise de Paor, Carraroe (IE); Kevin J Hyland, Dublin (IE); Kevin Jennings, Ballinasloe (IE); Derek Coburn, Dundalk (IE); Mike Lardner, Tuam (IE); Suzanne M Hughes, Barna (IE); Sean Boylan, Rahoon (IE); Brendan Walsh, Galway (IE)

(73) Assignee: 3Com Corporation, Santa Clara, CA (US)

( * ) Notice: Subject to any disclaimer, the term of this patent is extended or adjusted under 35 U.S.C. 154(b) by 448 days.

(21) Appl. No.: 09/893,659

(22) Filed: Jun. 29, 2001

(65) Prior Publication Data

US 2002/0184419 A1 Dec. 5, 2002

(30) Foreign Application Priority Data

Jun. 5, 2001 (GB) .............................................. 0113584

(51) Int. Cl.⁷ .......................... G06F 13/36; G06F 13/40
(52) U.S. Cl. ........................ 710/100; 710/307; 711/147; 712/32
(58) Field of Search ................................. 710/100, 300, 710/305, 307, 310, 52, 60, 72, 240; 709/253; 711/147, 169; 712/32, 33; 370/416, 419; 340/825.5; 713/322

(56) References Cited

U.S. PATENT DOCUMENTS

| | | | |
|---|---|---|---|
| 4,451,827 A | * 5/1984 | Kahn et al. | 340/825.52 |
| 5,974,487 A | 10/1999 | Hartmann | |
| 6,167,475 A | * 12/2000 | Carr | 710/113 |
| 6,425,060 B1 | * 7/2002 | Mounes-Toussi et al. | 711/158 |
| 6,601,126 B1 | * 7/2003 | Zaidi et al. | 710/305 |

FOREIGN PATENT DOCUMENTS

EP  0649096 A2  4/1995

OTHER PUBLICATIONS

"A VLSI processor–switch for a dual IEEE–796 bus with shared and dual–port memories" by J. Opsommer and E. H. D'Hollander (Abstract only).*

* cited by examiner

Primary Examiner—Gopal C. Ray
(74) Attorney, Agent, or Firm—Nixon & Vanderhye P.C.

(57) ABSTRACT

An architecture for a system on a chip wherein functional cores have wrappers for compatibility with a common bus system and the bus system includes aggregators for bus transactions of different speeds and/or bus widths.

18 Claims, 12 Drawing Sheets

FIG.11

ASIC SYSTEM ARCHITECTURE INCLUDING DATA AGGREGATION TECHNIQUE

CROSS REFERENCES TO RELATED APPLICATIONS

Pratt et al., entitled 'CLOCKING SCHEME FOR ASIC' Ser. No. 09/879,065 filed Jun. 13, 2001, U.S. Pat. No. 6,552,590, assigned commonly herewith and incorporated by reference herein.

Hughes et al., entitled 'DATA BUS SYSTEM INCLUDING POSTED READS AND WRITES' Ser. No. 09/893,658 filed of even date herewith, assigned commonly herewith, and incorporated by reference herein.

FIELD OF THE INVENTION

This invention relates to the design and layout of data processing systems, and particularly to network communication devices, such as switches and routers, which require a multiplicity of functional blocks, hereinafter called 'cores', which are pre-designed or independently designed to perform specific tasks. The invention more particularly relates to facilidtating the layout of such circuits in a single application specific integrated circuit, so as to provide a 'system on a chip'. More particularly the invention relates to the simplification of such layout by allowing aggregation of data buses.

BACKGROUND TO THE INVENTION

The automated design and layout of integrated circuits employing libraries of circuit cells or blocks is now commonplace owing to the unfeasibility of designing systems of enormous complexity by hand. Techniques for this purpose have developed over the last decade or so from comparatively simple rule based methods for the design of combinatorial circuits to present day placement and routing techniques wherein libraries of complex functional blocks or 'cores' can be used in conjunction with sophisticated layout tools to design a system with a given functionality and performance. Even so, the task of design and testing is still particularly lengthy and expensive.

Among the difficulties which are in the way of efficient design of systems on a chip are the different interface styles or configurations of cores, the general problems of achieving an efficient layout, the difficulty of achieving layouts which minimise power consumption, and achieving efficiency in the use of the available area on the silicon chip.

A main feature in the achievement of an efficient layout employing a library of cores is the architecture of the bus system by means of which data is to be transferred from core to core.

SUMMARY OF THE INVENTION

An important characteristic of the current design is that most and preferably all data transfers between cores are conducted by way of memory, which may be on-chip memory, such as a scratch pad, or may be off-chip memory such as flash memory or dynamic random access memory. A concomitant of this approach is that data buses from the cores need to be aggregated together. Traditional approaches to aggregation and arbitration between contentious requirements for the same bandwidth on a bus have been based on the transfer of data from all the relevant cores at a common rate. One aspect of the present invention is the ability to aggregate data occurring at different rates from different cores. This requires the inclusion of buffering in arbiters and also possibly 'wrappers' which are provided for individual cores if necessary so that they are compatible with the rest of the bus architecture. At each arbitration point, relevant cores allocated enough bandwidth to allow them to transfer data to or from multiple memories at the design rate of the individual cores. Data at such arbitration points is aggregated from all connected cores and is dispatched towards memory, or higher arbiters, typically at an increased rate such that all lower cores never encounter an overrun or underrun situation, or alternatively with a rate lower than the sum of data rates of aggregated paths, with handshaking limiting the flow rate, and arbitration mechanisms enabling the desired throughput particular to each path.

A further aspect of the invention is to provide for automatic bus width alignment at arbitration points. Most cores output data whose width is (for example) either 32 bits or a multiple or sub-multiple thereof. At arbitration points data from cores narrower than a predetermined width, e.g. 32 bits, is packed into 32 bit words, unused bytes being marked as invalid by accompanying enable flags. Such 32 bit words make their way up the arbitration hierarchy until they reach their appropriate target destination (typically memory), where the data may be unpacked. This unpacking may include discarding any invalid padding bytes included by the source if data paths at a destination point, or exit point from an aggregation element, are narrower than those earlier in the aggregation chain.

Further objects and features of the invention will become apparent from the following specific description and the embodiments described in the accompanying drawings.

DETAILED DESCRIPTION

As mentioned hitherto, the present invention generally relates to techniques for the improved design and layout of a system on a chip. The successful accomplishment of efficient design, in terms of time taken, a minimum occupation of area on the chip (i.e. minimum 'silicon overhead') and so on is a combination of various techniques which must be used coherently. For any particular system it may be necessary to comprise between competing desiderata.

A concept underlying the invention is the separation of cores from the generic architecture. When this is successfully done, cores of (in general) any type, from any source with appropriate pre-work, can be matched to the remainder of the system. Unlike typical approaches, this can be done in a way which satisfies both the needs of the core (such as bandwidth and latency) and the needs of the system at the same time. In a typical system, a high-performance bus system is used even in the case of mixed-performance cores, requiring low-performance cores to operate at high-speed, implying wide I/O bus widths and high clocking rates. In the system described here, bus width, clocking rates and other parameters are chosen to meet the aggregate performance of each core on a per-core basis, but communication with the system still adheres to a standard format, making interoperability between cores seamless, but without the penalty of requiring all cores to have a high performance capability.

The overall approach to doing this is the design of a generic bus structure connected to a data aggregation structure and developing (if necessary) a wrapper for each core to convert each core interface to this structure. When archived, each core will be archived in a library complete with its wrapper for future integration, so that the core may be extracted on its own or in combination with one or more wrappers (dependent on the application) designed and tested with the core. When future cores are obtained from any particular source, consideration must be given as to the applicability of such a core to a wrapper system. It is general unlikely that any new core will not fit into one of the wrapper styles already met to be compatible with the overall system.

A preferred, but not necessarily essential, form of the invention utilises the number-based clocking scheme which is the subject of the aforementioned application for Pratt et al., the contents of which are incorporated by reference herein. Also, a preferred embodiment of the invention is intended to be compatible with the memory bus system which is the subject of the aforementioned co-pending application of Hughes et al., filed on the same day as the present application. Some of the Figures in the drawings that follow correspond to Figures in those two applications.

Generic Architecture

Figure 1:
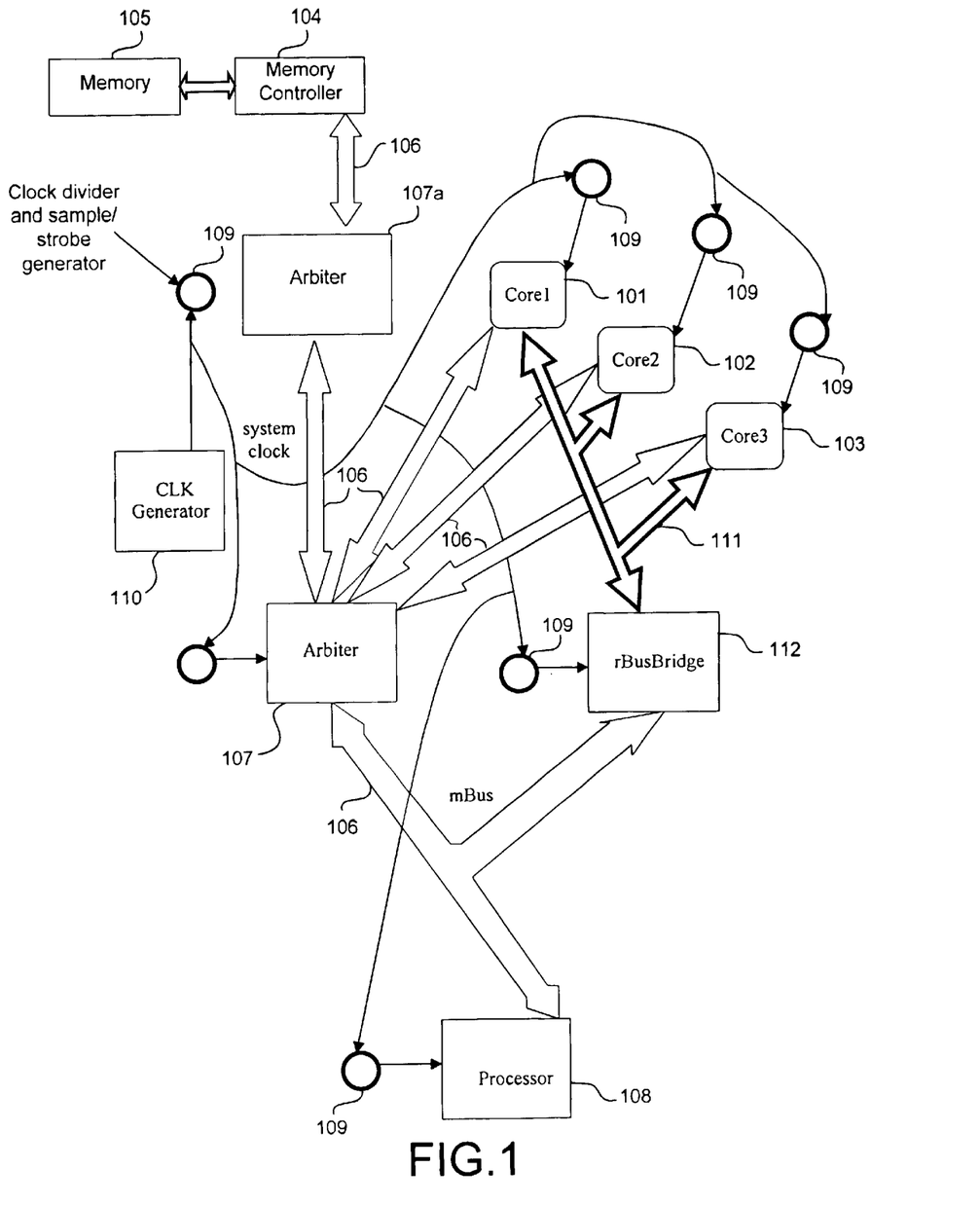
FIG. 1 is a schematic diagram showing the general architecture suitable for supporting the present invention.

FIG. 1 of the drawings illustrates schematically various elements in a system on a chip so as to introduce the various concepts underlying the present invention. The general concept is to render the operational blocks or 'cores' separately from the generic architecture.

One chief way in which this is achieved is to require that, so far as possible, all data transfers between cores occur via a memory so that one can determine a generic memory bus structure and therefore generic bus interfaces. Then if necessary adapting a core to the standard interface requires only the development of an appropriate wrapper.

The term 'core' is intended to refer to some self-contained function, typically implemented by some combination of logic blocks, state machines, processing elements including CPUs and associated program memory, data memory elements and possibly mixed digital/analog functions which co-operate to perform a specific task or specific set of related tasks. A core may or may not include input and output pins of the chip but will always have one or more communication paths. Examples of cores will be given later, as will a specific example of a core and an example of wrappers for cores.

In the schematic represented in FIG. 1, there are three cores 101, 102 and 103. These are not interconnected for data transfers but instead are all connected via a memory bus system to a memory controller 104 that controls reading and writing operations for a memory 105, which may be large scale dynamic random access memory located off-chip or may be lesser memory, such as a scratch pad memory, according to the requirements of the design preference. Generally speaking a system on a chip will include some on-chip memory but, particularly where a large volume memory is required, most of the memory may be located off-chip.

The path for data transfers between the cores and the memory controller is constituted by a memory bus, often shortened herein to 'mBus'. This is the bus 106 of which there are sections between each core and an 'arbiter' 107, between a processor 108 and the arbiter 107, between arbiter 107 and another arbiter 107a and between arbiter 107a and the memory controller 104. The bus sections all employ the same signal conventions but may differ from each other in respect of the data width and operating speed.

Arbiter 107 aggregates the data transfers (in the direction towards memory) occurring on the bus sections 106 and has a single memory bus path to arbiter 107a. This may be coupled to a multiplicity of bus sections (not shown) and may aggregate in a manner similar to arbiter 107.

The aggregation function performed by the arbiters is a multiplexing so as to present the data on the various bus segments (which may operate at different speeds) into a common co-ordinated bus transfer. The arbitration function of the arbiters 107 and 107a is the manner in which data transfers which are competing for access to the next stage of arbitration and aggregation are selected, for example on a round robin basis. Normally, as will be described later, each arbiter/aggregator includes buffer memory coupled to each of the memory bus sections.

Although individual cores such as core 101, may include processors such as CPUs, the term 'processor' in relation to the processor 108 is intended to refer to a processor which cannot only effect data transfers between itself and the memory but also initiate control or management data transfers between itself and the various cores. One purpose of such transfers is to write in or read from status and control registers in the individual cores. In general the cores can themselves affect information transfer between themselves on a register bus 111, conveniently termed herein 'rBus'.

The processor 108 could be organised so that it has an interface (register bus interface) coupled directly to the rBus 111 but in this example it has only a memory bus interface and needs a register bus (rBusBridge) to render the transactions compatible with the register bus, as described in the contemporary application.

The other elements shown in FIG. 1 are 'clock dividers and sample/strobe generators' 109 and a system clock generator (CLK Generator) 110.

The clock generator 110 generates a high frequency stable system clock (CLK) for use throughout the chip. To avoid undue loading of the system clock and also to facilitate the generation of local clocks and also the transfer of data across clock domains without necessarily employing elastic buffers or synchronisers, the system clock may be divided down to provide some appropriate sub-multiple clock as well as other clocks, namely 'logic' clocks intended for controlling the internal operation of a core or a block within a core, or various blocks within arbiters and aggregators, a 'sample' clock and a 'strobe' clock. The two latter are provided for controlling the clocking of data in to and out of a core or operational block.

In the system described in the aforementioned patent application of Pratt et al., relating to a clock system, all the clocks obey a specific set of rules relative to the system clock and, where appropriate, to sub-multiples of the system clock. More particularly, the system clock has alternative 'positive' and 'negative' edges between binary values and, adopting a notional numbering system such that odd numbered positive edges alternate with even numbered positive edges, clocks derived from the system clock each have positive edges each corresponding to an odd numbered positive edge of the system clock and negative edges each corresponding to an even numbered positive edge of the system clock. Furthermore, it is preferable that data be clocked out of an operational block or core on the positive edge of the respective clock and data be clocked into such a block or core on the negative edge of the respective clock. The sample and strobe clocks also obey these rules but are necessary in certain circumstances where there has to be data transfer between different blocks of different operating frequencies as described in the application of Pratt et al.

Figure 2:
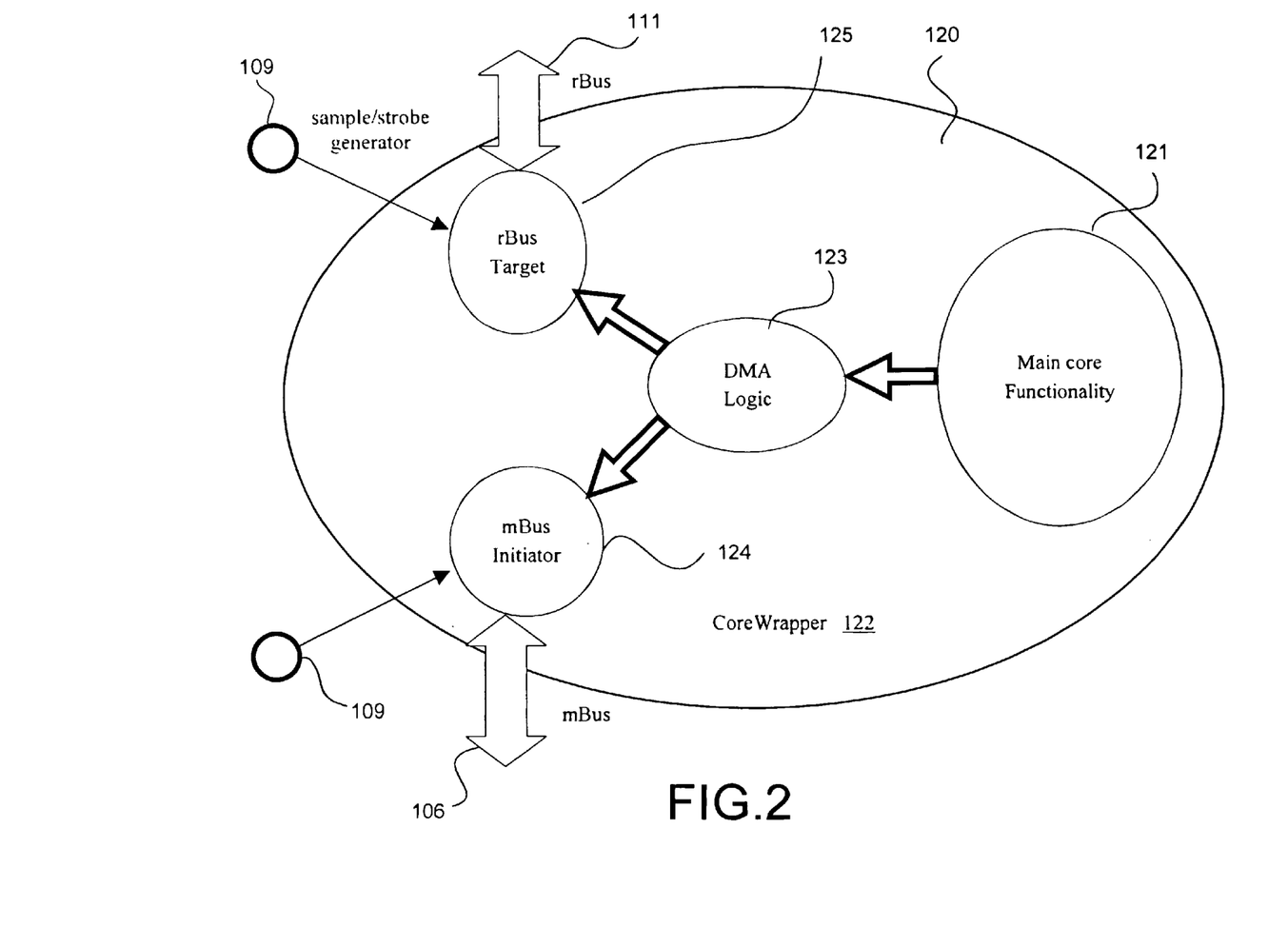
FIG. 2 illustrates a core in schematic terms.

A typical core and possible wrappers are described later. However, FIG. 2 illustrates schematically only the main elements of a core and its wrappers. The main core functionality, that is to say the essential operational capability of the core ignoring the need to translate the signals for compatibility with the buses, as shown at 121. The core wrapper is indicated schematically at 122. It includes direct memory access logic 123 if appropriate, providing signals for two interfaces, an mBus initiator 124 coupled to the memory bus (mBus) 106 and an rBus target interface 125 interfacing to the register bus (rBus) 111. Each of the interfaces 124 and 125 has a respective sample and strobe generator 109.

Figure 3:
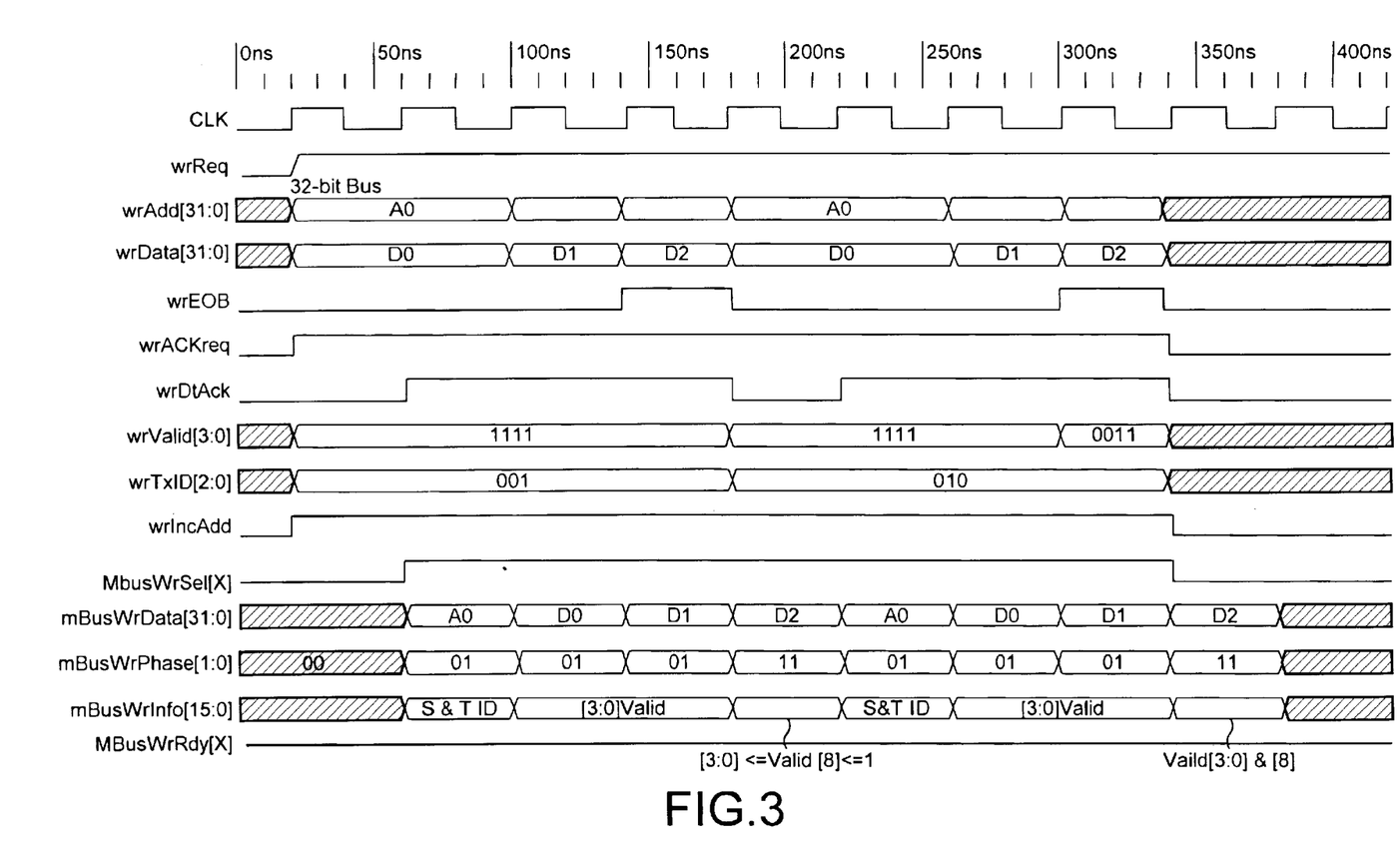
FIG. 3 is a timing diagram illustrating one form of a memory write cycle.

FIG. 3 illustrates a typical set of signals on the lines of a parallel data bus 106. The example given is the same as that in the contemporary application of Hughes et al.

The timing shown at FIG. 3 in nano-seconds is given merely by way of example.

The top wave form shown in FIG. 3 is the system clock signal (CLK). In the particular example given it is assumed that the data interface of the wrapper operates at the system clock frequency. As is further explained in the aforementioned contemporary application of Hughes et al., that is not essential.

The next line in FIG. 3 illustrates the status of a 'write request' signal (wReq), which is asserted at the start of the read cycle.

The third line in FIG. 3 is successive segments of a 32-bit write address signal (wrAdd). In this example, the address signals are multiplexed on the memory bus with the following data signals, shown by the line BusWrData [31:0] wherein the address word A0 occurs on the second clock cycle after the assertion of the write request signal and the three data words D0, D1 and D2 occur on the next three following clock cycles.

The signal 'wrEOB' denote the final byte (of the data).

The line denoted 'wrACKreq' denotes a signal by which a request for an acknowledgement is made. In the system described in the co-pending application of Hughes et al. the read and write transactions are 'posted' that is to say they include an identification of the source (typically a 6-bit field) and an identification of the transaction (a 3-bit field), all of which are included in the 9-bit parallel signal mBusWrInfo which provides the source and transaction identifiers at the same time as the address data and at other times includes validation bits.

The line denoted wrDtAck is a write acknowledgement.

The line denoted wrValid is a validation signal.

The line denoted wrTxID is an identification of the write transaction.

The line denoted wrIncAdd is a special signal which denotes that the addressing will be incremented.

The line denoted mBusWrSel represents a multiplicity of different lines one of which is asserted, as shown, to select the correct target for the write transaction.

The line denoted BusWrPhase represents a 2-bit parallel signal of which the value '01' denotes a start of frame, the value '11' denotes an end of frame, the value '10' (not shown in FIG. 3 but illustrated later) denotes data and '00' denotes the idle or null state.

The line mBusWrRdy represents a multiplicity of lines, each specific to a target and indicates that space is available in the target to write data. It is assumed in FIG. 3 that the target is in that condition.

The memory bus may convey further signals which are not directly relevant to the invention.

Figure 4:
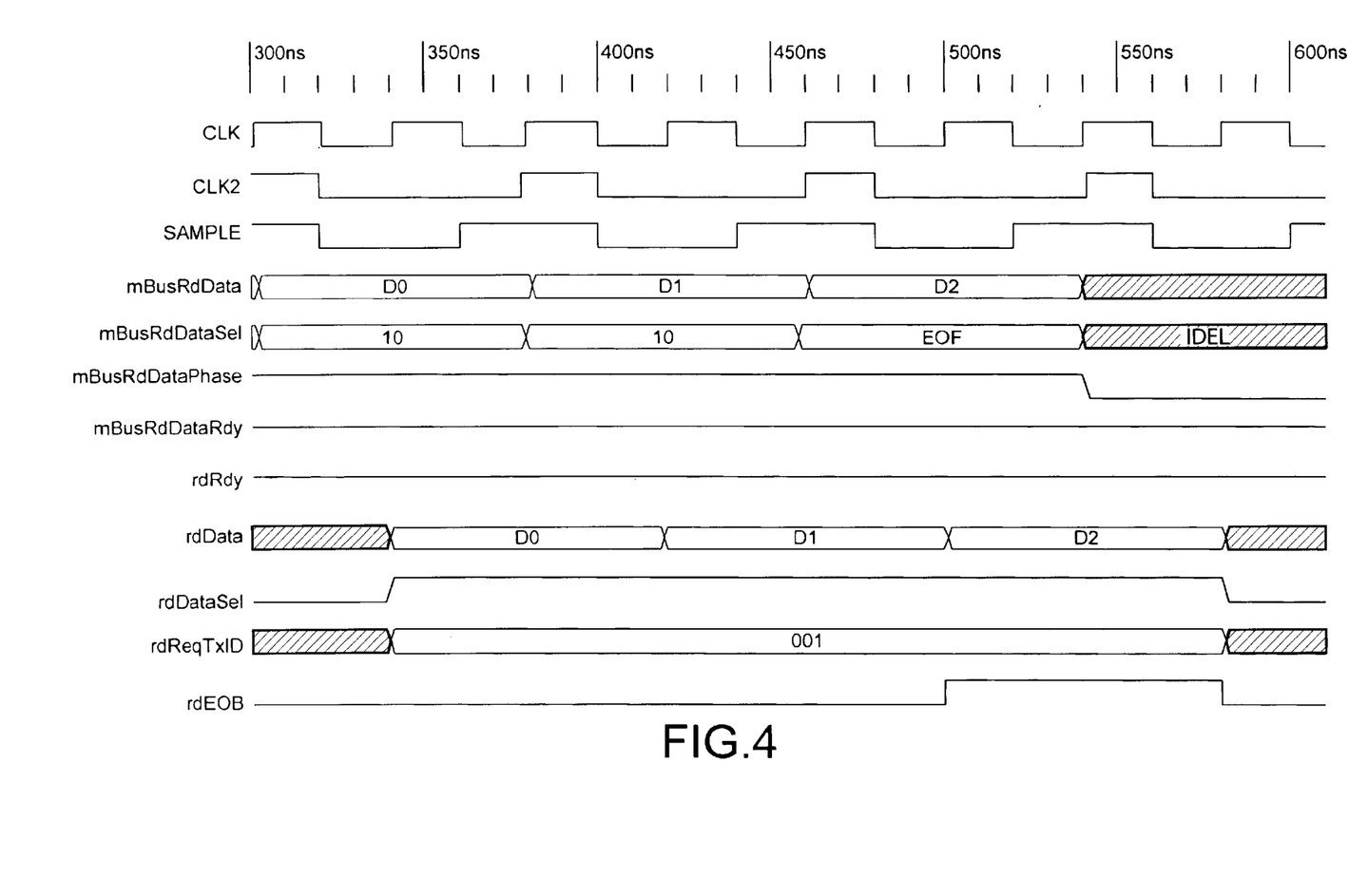
FIG. 4 is a timing diagram showing one form of a memory read cycle.

FIG. 4 illustrates signals in a typical read transaction. Line CLK denotes the system clock. Line CLK2 denotes a derived clock signal at half the frequency of the signal clock but conforming the rules mentioned above and also in the co-pending application Ser. No. 0104828.9. The line 'SAMPLE' is likewise a sampling clock employed for clocking data into the data interface and conforming to the same rules as mentioned above. The line 'mBusRdData' contains the source and transaction identifiers in the first phase of the cycle. The source identifier can be used in the downward (read) path of the arbiter to direct the data to the correct initiator. The line BusRdDataPhase has the same significance as the phase signal for writing. The line mBusRdDataSel is for selecting the target. The line mBusRdDataRdy indicates that the relevant target is ready, rdData indicates the data read into the core, rdDataSel selects the correct core. The rdReqTxID is the identity of the transaction and rdEOB indicates the end of the byte.

It may be noted that data is being read into the core at half the system clock frequency. This is the purpose of the sample signal, as further described in the application of Pratt et al.

Register Interface Bus

This is intended, as indicated above to be independent of the data interface but depending on the cores the wrapper may have to have a built in arbitration element between its registers and a memory bus if the cores should use a bus for both data transfers and register transactions.

Figure 5:
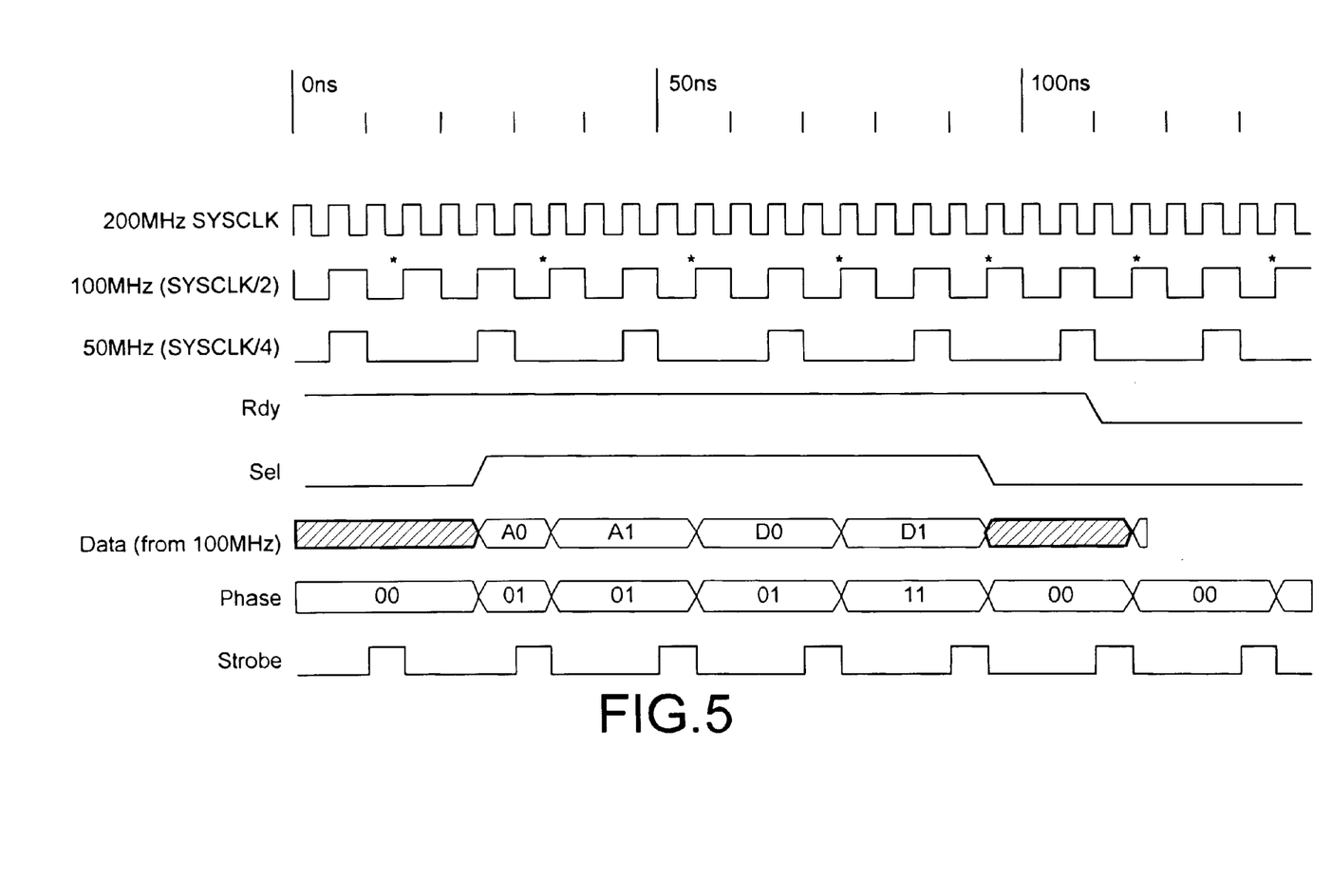
FIG. 5 is a timing diagram illustrating one possible relationship between various clocks that may be used for controlling cores.

On the assumption that a separate register bus is used. FIG. 5 illustrates a typical read cycle and FIG. 6 a typical write cycle. In FIG. 5, the 50 MHz signal (SYSCLK/4) is used to generate the 'Strobe' signal. 'Rdy' indicates that a core has processed the 'register' data. 'Sel' is a select signal for a particular target core. The 'Data' line indicates address (A0, A1) multiplexed with register data (D0, D1). The 'Phase' line has the same meaning as above. The strobe signal controls the transfer of data to be on selected edges (denoted by an asterisk) of the SYSCLK/2.

Figure 6:
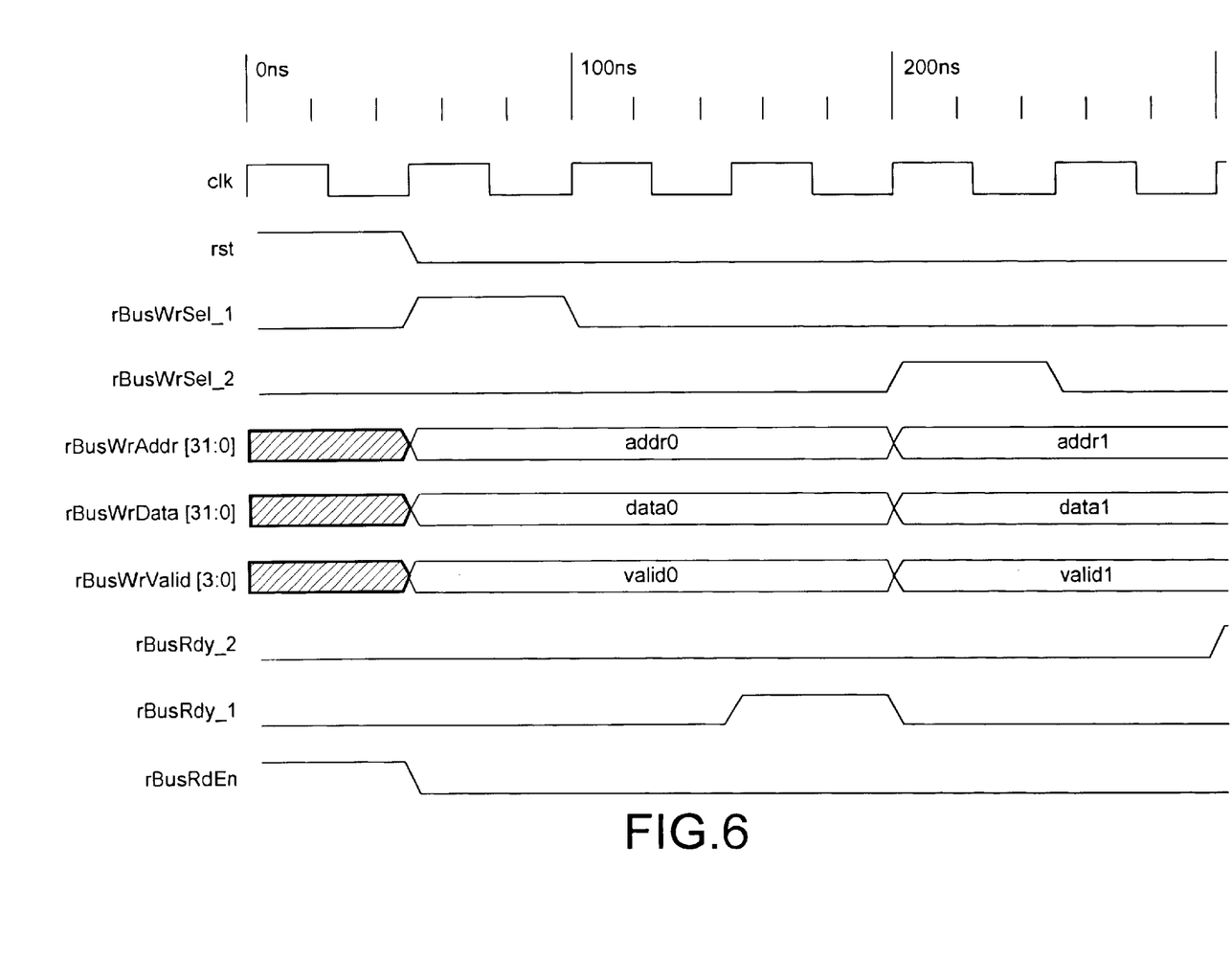
FIG. 6 is another timing diagram illustrating the relationship between various clocks which may be used for controlling cores in the present invention.

In FIG. 6, 'clk' indicates the respective write clock, 'rst' a reset signal. 'rBusWrSel' indicates the selection at different times of the two different targets, rBusWrAddr [31:0] denotes the write address, rBusWrData [31:0] denote the write data. rBusWrValid [3:0] are validating bits, and 'rBus- Rdy' denotes the completion of the respective transaction and 'rBusRdEn' is an enabling signal.

Clocking and Buffering

As is explained in the application of Pratt et al., it is preferable to employ a clocking scheme in which the loading of a system wide reference clock is minimal and in general cores are provided with their own clock dividers which operate on sub-multiples of the system clock frequency, special rules applying to the permitted transitions for such sub-clocks, particularly those used for internal logic. Reference should be made to that other application for details. It is sufficient at present to say that where, as is preferred, cores can run at a sub-multiple of the system clock, a synchronous interface may be used for clocking and buffering in a wrapper. Where the core operates at a non-integral sub-multiple of the system clock, an elastic buffer interface may be necessary for allowing data to cross a clock domain boundary between the core and the remainder of the system. It is also relevant to mention that the preferred clock system employed allows a multiplicity of clock trees where each tree can have random skew from others; this approach is less strenuous on layout than requiring single skewless system-wide clock.

Aggregation Points in Data and Registers Paths

Where data congregates in one place, such as SDRAM, it would create a huge layout bottleneck to attempt to bring a large number of buses together in a single multiplexer and arbitration point. Instead, a sequence of pre-multiplexing and arbitration points are used, called herein data aggregation points. As is disclosed specifically in FIG. 1, a multiplicity of mBus segments are aggregated before they are applied to the SDRAM interface in parallel with other similarly aggregated data paths. These aggregations can be placed at various locations on the die, thereby avoiding difficult bottlenecks.

Register paths may be laid out using a similar approach.

Layer Optimised Bus Structure

Instead of adopting a standard bus structure such as PCI, which is not optimal for layout within ASICs, the preferred bus structure to be employed employs the following features.

Address and data are multiplexed, on the basis that data is burst oriented in most system on a chip applications. Most cores have built in DMA engines targeting memories such as SDRAM, which works optimally in bust mode. Similarly, cache fills or write backs for RARISC (reduced instruction set computers) operate in bursts. Also, many applications, particularly those involving data-processing, have a requirement to move blocks or data, sequentially organised, so it is more efficient to indicate a target address just once, all subsequent information requiring no address information. This reduces the number of wires to route on a chip, by eliminating the address paths. With a scheme like this, the first cycle, or set of cycles depending on the bus width, is the address phase and it is followed by a multiplicity of data phases. The benefit is that the bus system is fully utilised, versus a system with an address bus, where only the first phase would typically have useful information—the start address of the burst of data.

Secondly, bus widths of any size can be used at any point in the design. Interfacing between links of different data widths can be achieved by appropriate alignment and dropping of unused bytes, and can be handled at the aggregation points. Combined with operating each link at only the clock rate it needs, this further reduces the layout challenge of slower performance parts of the system while supplying the performance needed in higher bandwidth parts of the system.

Minimal Power Consumption

In general it is preferable to achieve minimal power consumption while optimising layout by operating each block only at the clock frequency it requires to achieve the performance required by the block. This includes "zero" Hz, for cores that are to be disabled in particular applications, either permanently for some applications, or dynamically when it's feasible to place them in "sleep mode" when not currently in use. Interfaces between the block and aggregation points should also be clocked only at the speed needed to clock data between interfaces at the required data rate, rather than for example at the system clock frequency.

In addition, within cores, multiple speed lower speed clocks may be used.

Automated Layout

A system on a chip which is developed with the aid of the present invention is preferably laid out using the layout tool described in patent application Ser. No. 0104945.1 filed Feb. 28, 2001. Such a layout tool includes arbitration functions, designed to meet the requirements of various cores, such as latency bandwidth etc previously characterised and held in the library. The layout tool will also take into account inter-clock domain buffering, bus width translation and alignment, clock generation and aggregation elements. These elements are preferably created using Verilog (or VHDL, or any suitable hardware description language) wherein parameters can be changed.

Example of a System on a Chip

It should be understood that the main purpose of the present invention is to assist in providing an architecture for a variety of systems with recourse to a core library. Nevertheless, the description of the system in FIG. 1 is illustrated to show the general layout of such systems.

Figure 7:
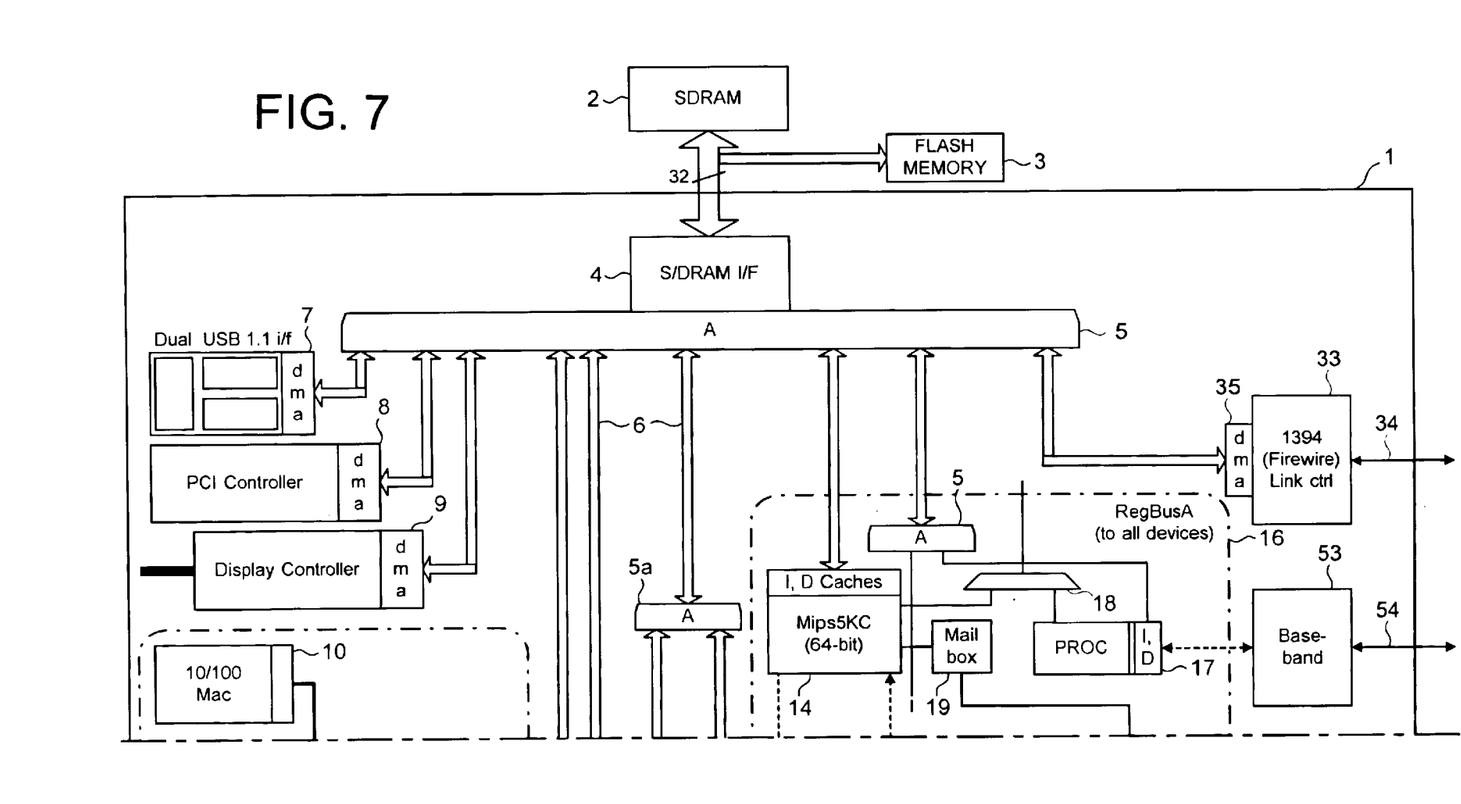
FIGS. 7 and 7A are a schematic illustration of one example of a system on-a-chip laid out with the aid of the present invention.

FIG. 7 illustrates merely by way of example a system 1 on a chip. Most of the operating circuits or cores of the system are located on the chip itself. Exceptionally there are certain display devices or keypads and more particularly, the greater part of the memory which is employed by the system is off-chip. This memory is constituted by SDRAM 2 and flash memory 3 both coupled by a 32-bit bus to a SDRAM interface 4. The external SDRAM has 32-bit, 16-bit and 8-bit bus width options which support memory sizes from 2 to 128 megabytes. The external flash memory may be 8 or 16 bits wide providing from 0.5 to 64 megabytes and shares the SDRAM bus. Internal memory for the chip will be described later. It is inherent in the scheme that all data between operating cores is exchanged by means of shared memory space.

Figure 7A:
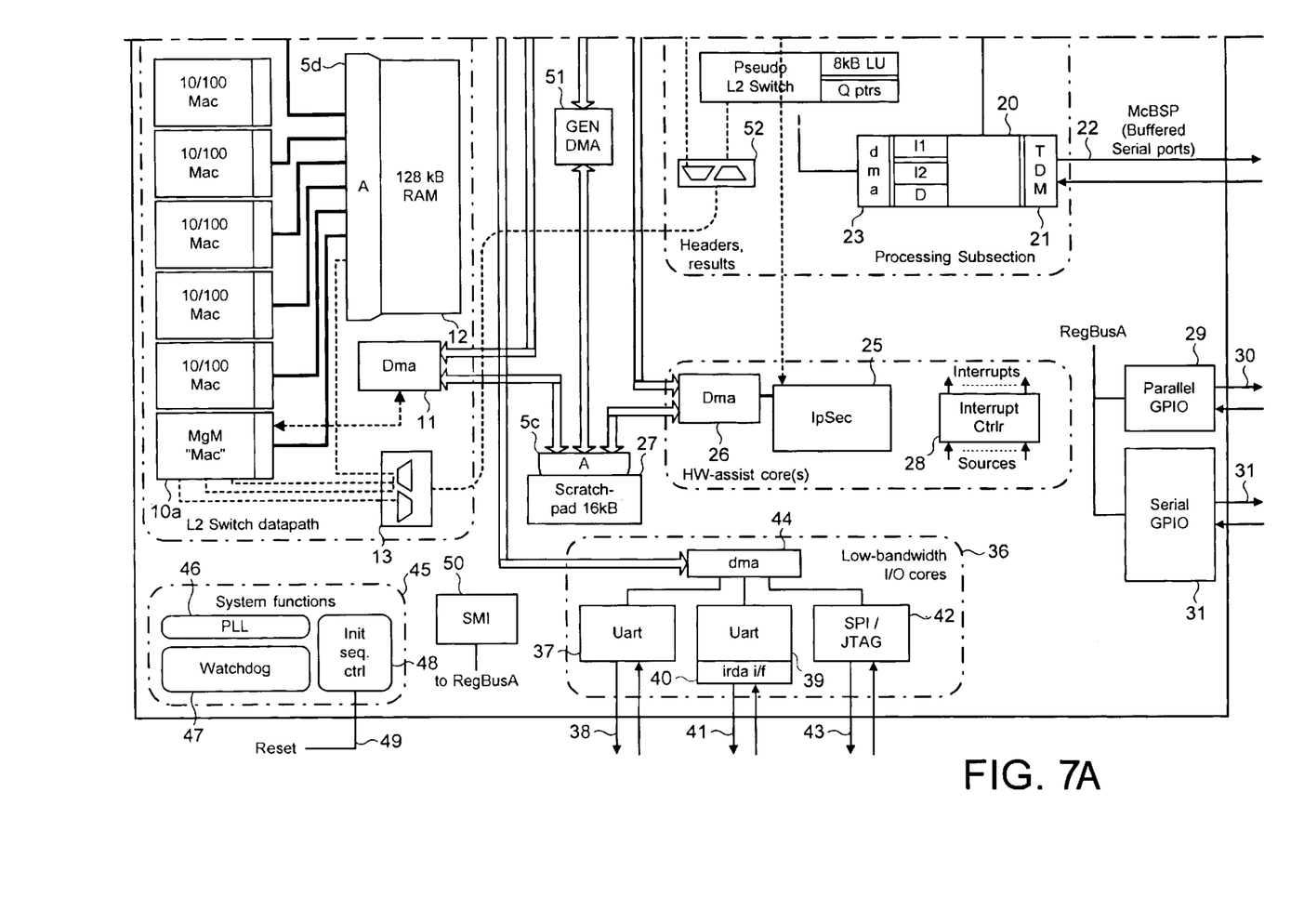

FIGS. 7 and 7A illustrate an aggregator 5 which one side is coupled to the SDRAM interface 4 and multiplexes data from a multiplicity of internal buses 6. As mentioned hitherto, to avoid undue aggregation, there is a hierarchy of aggregators. Sub-aggregators are shown at 5*a* and 5*b* for the aggregator A. A further aggregator is described in due course.

As may be seen, the system supports a wide variety of operating functions. Coupled to the aggregator 5 by way of respective buses are a dual USB interface 7, a PCI controller 8 and a display controller 9. Each of these 'cores' has a direct medium access controller (dma). Also coupled to the aggregator 5 is a 'layer 2' switch data path comprises a multiplicity of media access control devices (MACs) 10, these are operable either at 10 or 100 megabits per second (for example) and include a management MAC 10*a*. These devices are coupled by way of an aggregator 5*d* to a 128 kilobit random access memory 12. Also coupled by way of the aggregator 5d is a DMA 11 which is coupled by way of a bus 6 to the aggregator 5 is and is also coupled to the aggregator 5c. Input/output multiplexers 13 connect the MACs by way of other input/output multiplexers 52 to a layer 2 switch processor 14 and a further processor 15. These processors are within a processing sub-section which includes a processor 17. A multiplexer 18 couples processor 14 and processor 17 to a register bus, designated 'RegBusA' which is coupled to all the devices. Also included within the processing sub-section is a processor 20 having a TDM 21 coupled by way of buffered serial ports 22. Processor 20 also has a DMA controller 23 between a cache memory and a sub-aggregator 5b. The cache memory of processor 17 is also coupled to this aggregator. A mail box 19 is coupled between processor 14 and processor 17. Section 16 also includes a 'layer 2' switch processor 24.

A section of hardware assist cores is constituted by a security controller 25 and an interrupt controller 24. Security controller 25 has a DMA controller coupled to sub-aggregators 5a and 5c. Aggregator 5c is coupled to an internal scratch pad 27.

Register bus A is coupled to a parallel input/output interface 29 coupled to parallel input and output lines 30 and is also coupled to a serial general purpose input/output interface 31 coupled to input/output serial lines 32.

Also coupled to aggregator 5 is a fire wire link circuit 33 having a fire wire link 34 and a DMA controller 35.

Also included on the circuit are low bandwidth input/output cores including a Uart 37 having input/output lines 38, a Uart 39 having an interface 40 and input and output lines 42, an SPI/JTAG core having input and output lines 43. Cores 37, 39 and 42 have a common DMA controller 44 coupled by way of a bus to aggregator 5.

Certain conventional system functions are provided by a clocking circuit 46, a watchdog circuit 47 and an internal sequence controller 48 having an output line 49.

A generic DMA controller 51, for providing memory to memory copies, is coupled between aggregators 5a and 5b.

A system of this nature is intended to perform the packet reception, de-encapsulation, look-up, bridging, routing, monitoring and other functions which are intended for performance in a layer 2/layer 3 bridge/router. The individual functions will not be described since for the most part all the functions are well known in the art.

In the design of such a circuit to achieve any particular performance, the various cores which are illustrated will be available, particularly in Verilog or VHDL, from a core library.

The main purpose of the present invention is to facilitate the layout of the system by enabling the avoidance of bottlenecks which might otherwise be caused by an undue aggregation of data at multiplexing points. This is achieved partly by of providing a generic interface for the individual cores, and if necessary providing wrappers for those cores so that the interface presented to the bus system is of the generic type, and employing a hierarchical aggregation system.

Figure 8:
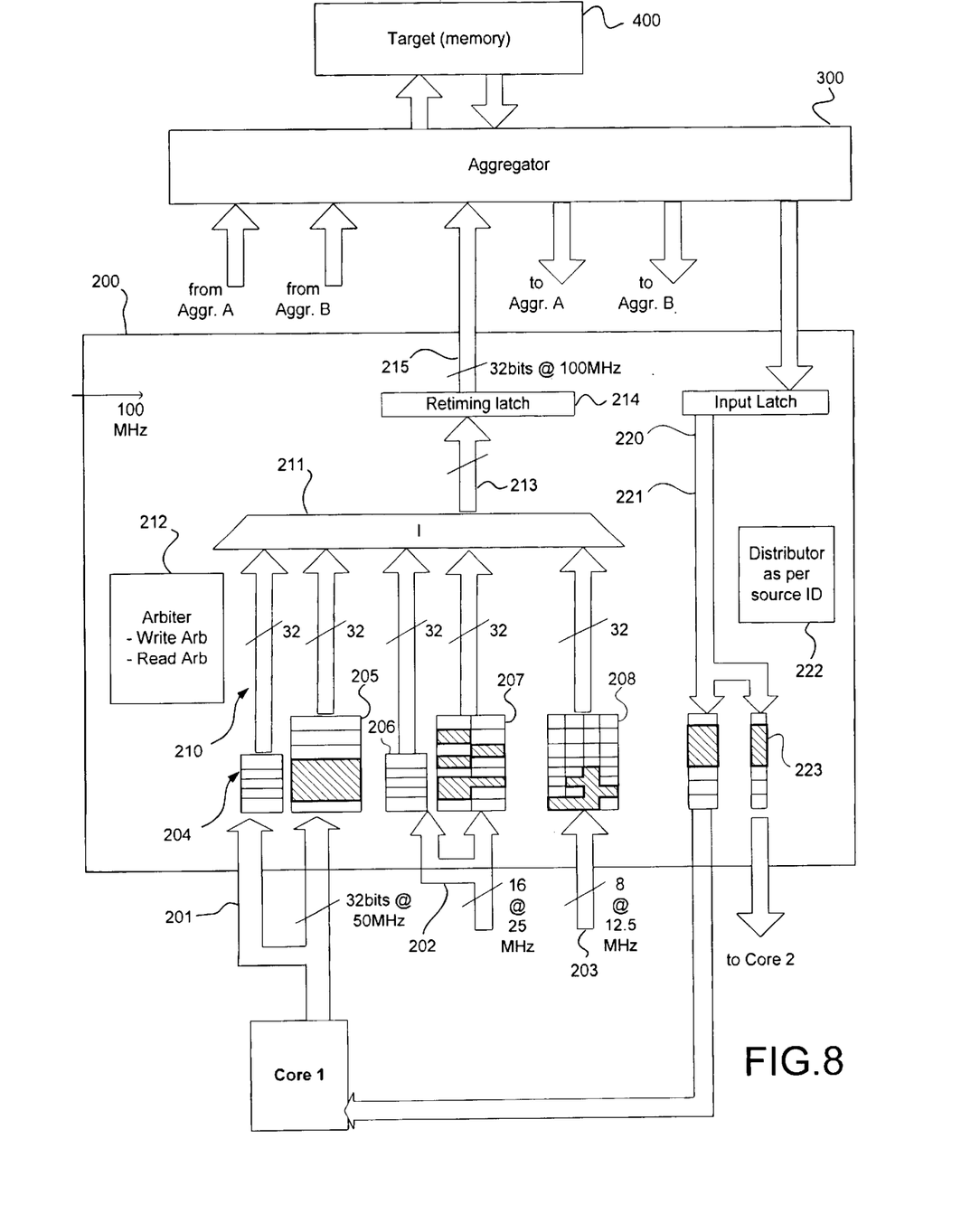
FIG. 8 illustrates part of an aggregation system according to the invention.

FIG. 8 illustrates an aggregator including a read and write arbiter, for use in the present invention. In the data direction towards a target, namely a memory, the aggregator 200 receives in this example data on lines 201 from a core 1, and data on other lines 202 and 203 from other cores which are connected by respective buses to the aggregator. Data from the inputs is presented 32 bits wide on internal buses 210 to a multiplexer 211 which is controlled by an arbiter 212. The selected output from the multiplexer 211 is coupled by way of an internal bus 213 to a re-timing latch 214, from which data proceeds on output bus 215 to the next aggregation point 300 and from there to the target (memory) 400.

In the example shown in FIG. 8, it is assumed that the aggregator 200 receives via respective interfaces data read or write requests from any one of a multiplicity (in this case 3) of cores of which only one, core 1, is shown, communicating by way of memory bus segment 201 with the aggregator 200. The purpose of the aggregator 200 is to combine the memory buses connected to the cores into a single memory bus segment proceeding to the next aggregator. This process will be repeated as necessary throughout the system so as to ultimately have a single memory bus segment conveying all the respective read or write transactions for each given target memory. In the example, there is a memory bus segment from aggregator 200 to the next aggregator (300) which has a single memory bus segment to a single target 400. The connections between aggregators 200 and 300 and between aggregator 300 and the target memory are shown as bi-directional. In reality, the memory bus may consist of a set of parallel lines operated in half-duplex manner (allowing read and write transactions at different times) but may be a full-duplex bus system. Aggregator 300 is shown as having memory bus sections from different aggregators denoted A and B and read transactions proceeding likewise.

In the example given, the cores that direct read or write requests ultimately to the target 400 communicate with the aggregator at different frequencies. One benefit of the present system is that different clock frequencies on the memory bus system can easily be accommodated. In the present example, data is received from core 1 at 50 MHz, from a second core over a memory bus segment 202 at 25 MHz and from a third core over memory bus segment 203 at 12.5 MHz.

In respect of memory segment 201, the FIFO 204 is coupled to store address and other information, the FIFO 205 to store data. Both will be used in the case of write bursts, the one on the left only in the case of read commands. FIFO 205 will store the address, the number of bytes needed and the source ID/transaction number so that later the resulting read data can be directed back to the originator. FIFOs 206 and 207 perform the same functions in respect of memory section 202. For the sake of completeness however, the buffer or memory bus segment 203 coupled to FIFO 208 does not have this facility and it is assumed that the core connected to this bus need only perform write transactions or has implemented the option of placing address information for both read and writes in the same FIFO as the data. It should be remarked that the benefit of separate FIFOs is the ability to separate arbitration for reads versus writes, which can have benefit in some situations. For example, it may be more appropriate to do all outstanding read requests before starting write requests to minimise the number of times the bus needs to change mode.

Moreover, the parallel address FIFO facility can be used to keep track of source ID information along with address information in order to direct write acknowledges back to the originator or another designated core if desired. Again, one may share a single buffer with address or source ID and data information.

Furthermore, as shown in respect of the FIFO coupled to memory bus segment 202, and for the FIFO coupled to memory bus segment 203, the 16 and 18-bit data respectively is packed into 32-bit wide data so that all the data proceeding through the lines 210 to multiplexer 211 are the same width.

The aggregator includes an arbiter 212 which is coupled to the FIFOs. The arbiter will resolve, in any convenient manner, contentions between the data and determine the order in which data is multiplexed onto the line 213. It can for example employ round robin arbitration.

In the downward direction, data received from the aggregator 300 is clocked in by way of an input latch 220 and coupled by way of lines 221 to output FIFOs 223. In general, there will be a set of FIFOs 223 for each core. The output line 224 is shown separately from input line 201 but, as will be apparent from earlier description, it may employ the same data lines or different data lines according to whether the bus is full-duplex or half-duplex.

In the present system, the distributor 222 will determine the choice of FIFO 223 according to the source ID in the read transaction.

Figure 9:
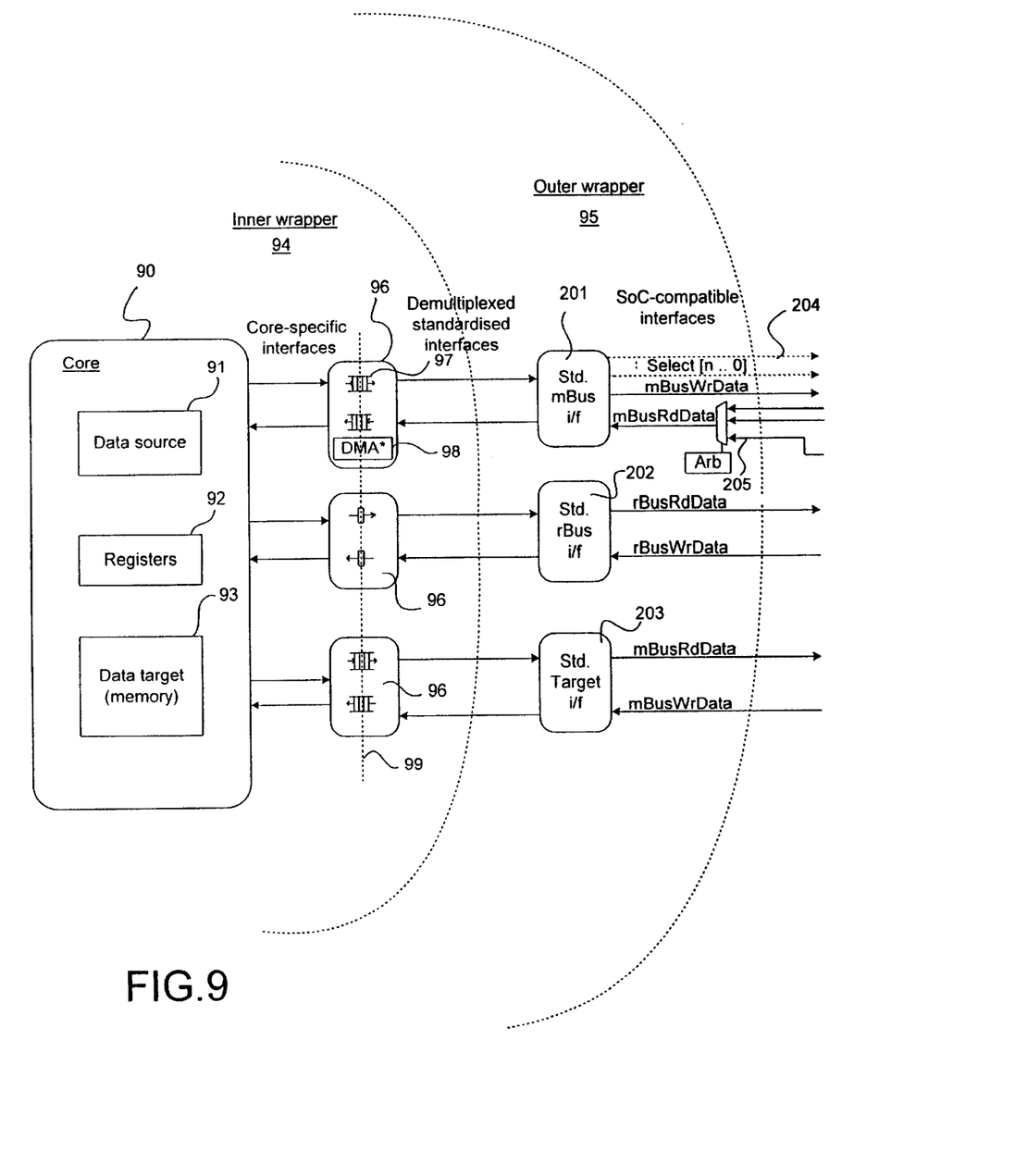
FIG. 9 illustrates a core with wrappers according to the invention.

FIG. 9 illustrates a typical core 90 and its wrappers. The core has a data source 91, registers 92 and internal memory. The core has in this example an inner wrapper 94 and an outer wrapper 95. The inner wrapper contains core specific interfaces 96 which translate between the signal formats employed in the core and the standardised formats employed on the memory and register buses. They may include buffering 97 if there is a clock domain boundary 99 and may include a DMA controller 98.

The outer wrapper 95 comprises standard interfaces 201 to 203 the mBus interface 201 has select lines 204 for selecting a target for write requests, provides write data (mBusWrData) and receives data from target memory (mBusRdData). FIG. 9 includes schematically the read distribution function 205 previously described in relation to FIG. 8. The rBus interface 202 transmits read data from the registers and receives write data for the registers. The target interface 203 is connected to a section of memory bus and conveys write transactions to and read transactions from the target memory 93. In this example it is assumed that the core includes memory which is accessible to other cores.

Figure 10:
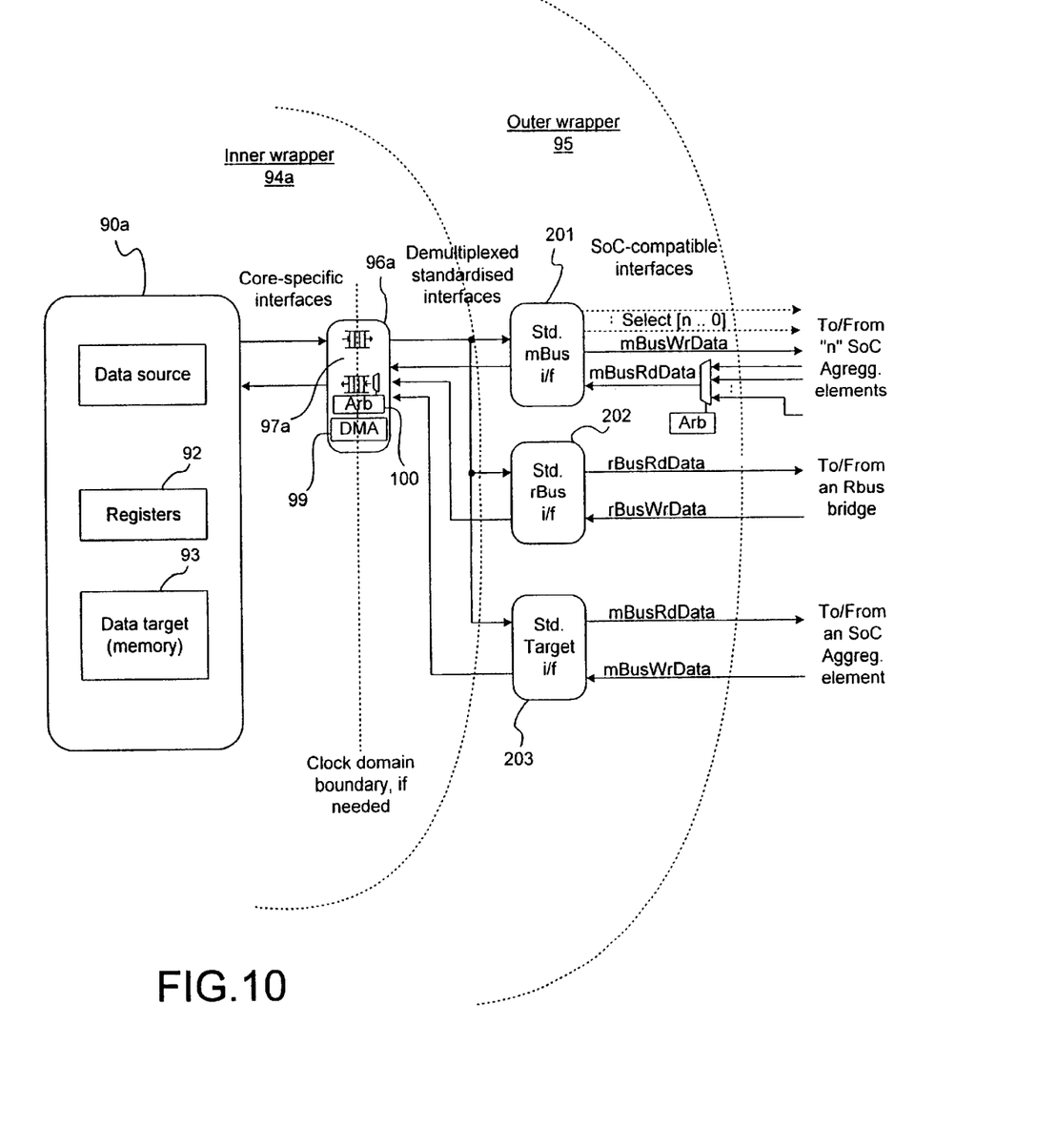
FIG. 10 illustrates another core with wrappers according to the invention.

FIG. 10 shows a core 90a which may perform the same function as core 90 but has a shared bus for data and register transactions. The wrapper has to differ from that shown in FIG. 9. In particular, instead of the three interfaces 96 in FIG. 9 the inner wrapper 94a has a single multiplexing interface 96a which includes buffering 97a, an DMA controller 99 and an arbitration function 100. The core and wrappers shown in FIG. 10 represent a more detailed version of the core and wrapper shown in FIG. 2.

Thus the system can accommodate various wrappers which are arranged in accordance with the bus system (e.g. shared busses or separate busses) of a specific core and/or the memory elements which may be embedded in the core.

Figure 11:
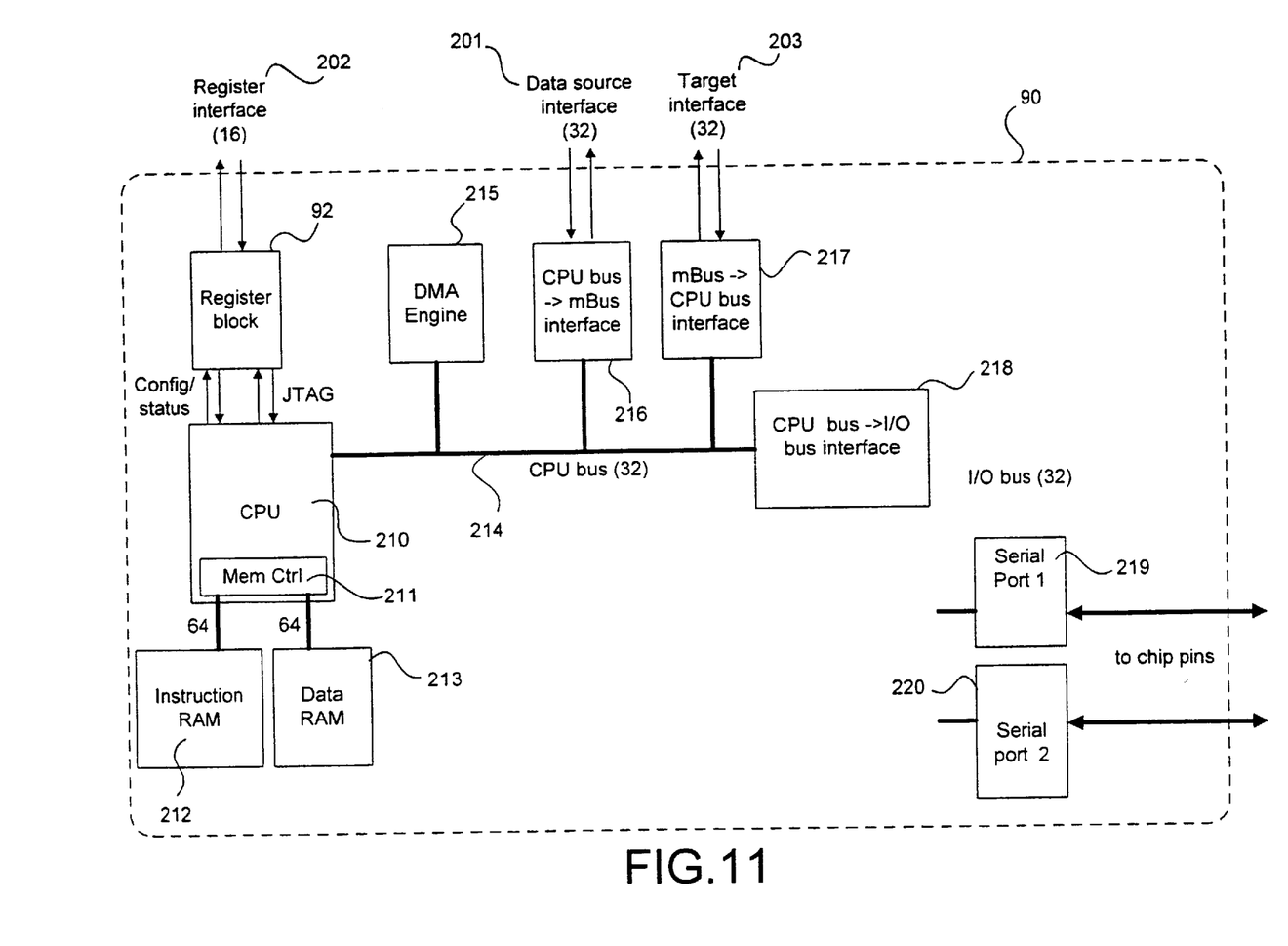
FIG. 11 illustrates one example of the main functional part of a core according to the invention.

FIG. 11 illustrates a typical core 90. In this example, the core 90 includes a CPU 210 which includes a memory control 211 coupled by way of 64-bit lines to an instruction memory (RAM) 212 and a data memory (RAM) 213. It is assumed in this example that the data RAM can constitute target memory corresponding to target memory 93 in FIG. 9.

The CPU is coupled to registers to convey configuration or status information as well as JTAG data to and from the registers 92. These are coupled by way of an interface 96 (FIG. 9) in the inner wrapper to the register interface 202 shown in FIG. 9.

The CPU has a main CPU bus 214 which is coupled to a DMA engine 215, and three interfaces 216, 217 and 218. The operation of the DMA engine is not particularly relevant to the present invention.

The CPU bus is coupled to the memory bus in order that read or write transactions originating the CPU and appearing on the CPU bus are directed to the relevant target memory. The CPU bus—mBus interface 216 is coupled, if necessary, by way of an interface 96 to the standard data source or memory bus interface 201 as shown in FIG. 9. Also, the memory bus to CPU bus interface 217 is coupled to the standard target interface 203 and conveys write and read transactions to the target memory shown in FIG. 9 as target memory 93 and represented in FIG. 10 by the data RAM or possibly the instruction RAM.

Although it is not particularly relevant to the present invention, the CPU bus will be coupled to a further interface 218 which couples the CPU bus to an input/output bus connected to serial ports 219 and 220 which may be connected to terminal pins on the chip.

What is claimed is:

1. An application specific integrated circuit which includes
   (a) a multiplicity of functional cores which generate data transfer transactions;
   (b) at least one memory controller for controlling at least one memory in accordance with said data transfer transactions;
   (c) a common memory bus system coupling the cores and the memory controller, and
   (d) at least one aggregator in said memory bus system, said aggregator being coupled to a multiplicity of memory bus sections extending in a sense towards the cores and including means for placing data transfer transactions on any of the multiplicity of memory bus sections on a common memory bus section extending in a sense towards said at least one memory controller, said aggregator being operative to place on said common memory bus section a data write transaction received by said aggregator on any of said multiplicity of memory bus sections and to direct to one of said multiplicity of memory bus sections a data read transaction received by said aggregator on said common memory bus section.

2. A circuit according to claim 1 wherein at least one of said multiplicity of memory bus sections has a different data transfer rate to others of said multiplicity of memory bus sections.

3. A circuit according to claim 1 wherein at least one of said multiplicity of memory bus sections has a different data width to others of said multiplicity of memory bus sections.

4. A circuit according to claim 1 wherein said aggregator includes FIFO stores for each of said multiplicity of memory bus sections and means for arbitrating between the stores to determine the order in which received data transfer transactions will be place on said common memory bus section.

5. An application specific integrated circuit which includes
   (a) a multiplicity of functional cores which generate data transfer transactions;
   (b) at least one memory controller for controlling at least one memory in accordance with said data transfer transactions;
   (c) a common memory bus system coupling the cores and the memory controller; and
   (d) at least one aggregator in said memory bus system, said aggregator being coupled to a multiplicity of memory bus sections extending in a sense towards the cores and including means for placing data transfer transactions, received on any of the multiplicity of memory bus sections, on a common memory bus section extending in a sense towards said at least one memory controller, said aggregator being operative to direct to one of said multiplicity of memory bus sections a data read transaction received by said aggregator on said common memory bus section, and wherein the aggregator includes means for providing for said common memory bus section a higher data transfer rate than any of said multiplicity of memory bus sections.

6. A circuit according to claim 5 wherein said aggregator includes FIFO stores for each of said multiplicity of memory bus sections and means for arbitrating between the stores to determine the order in which received data transfer transactions will be placed on said common memory bus section.

7. A circuit according to claim 5 wherein at least one of said multiplicity of memory bus sections has a different data transfer rate to others of said multiplicity of memory bus sections.

8. A circuit according to claim 5 wherein at least one of said multiplicity of memory bus sections has a different data width to others of said multiplicity of memory bus sections.

9. An application specific integrated circuit which includes
   (a) a multiplicity of functional cores which generate data transfer transactions, each of said data transfer transactions including an identification of its source;
   (b) at least one memory controller for controlling at least one memory in accordance with said data transfer transactions;
   (c) a common memory bus system coupling the cores and the memory controller; and
   (d) at least one aggregator in said memory bus system, said aggregator being coupled to a multiplicity of memory bus sections extending in a sense towards the cores and including means for placing data transfer transactions on any of the multiplicity of memory bus sections on a common memory bus section extending in a sense towards said at least one memory controller;
wherein said aggregator is operative to place on said common memory bus section a data write transaction received by said aggregator on any of said multiplicity of memory bus sections and to direct towards said source by one of said multiplicity of memory bus sections a data read transaction received by said aggregator on said common memory bus section.

10. A circuit according to claim 9 wherein said aggregator includes means responsive to said identification for directing data read from memory back towards said source.

11. A circuit according to claim 9 wherein each core includes an interface system which renders data transfer transactions compatible between the core and the memory bus system in accordance with the internal bus system and/or memory elements of that core.

12. A circuit according to claim 9 wherein said aggregator includes FIFO stores for each of said multiplicity of memory bus sections and means for arbitrating between the stores to determine the order in which received data transfer transactions will be placed on said common memory bus section.

13. A circuit according to claim 9 and including a multiplicity of aggregators in series between at least some cores and the memory controller.

14. A circuit according to claim 9 wherein at least one of said multiplicity of memory bus sections has a different data transfer rate to others of said multiplicity of memory bus sections.

15. A circuit according to claim 9 wherein at least one of said multiplicity of memory bus sections has a different data width to others of said multiplicity of memory bus sections.

16. An application specific integrated circuit which includes
   (a) a multiplicity of functional cores which generate data transfer transactions,
   (b) at least one memory controller for controlling at least one memory in accordance with said data transfer transactions,
   (c) a common memory bus system coupling the cores and the memory controller, and
   (d) at least one aggregator in said memory bus system, said aggregator being coupled to a multiplicity of memory bus sections extending in a sense towards the cores and including means for placing data transfer transactions on any of the multiplicity of memory bus sections on a common memory bus section extending in a sense towards said at least one memory controller;
wherein each core includes at least one interface which renders data transfer transactions compatible between the core and the memory bus system in accordance with an internal bus system and/or memory elements of said each core.

17. An application specific integrated circuit according to claim 16 wherein at least one interface in a core includes elastic buffer memory for the temporary storage of transactions coupled to and from a memory bus section.

18. An application specific integrated circuit according to claim 16 wherein at least one interface in a core is coupled to more than one of the memory bus sections.

* * * * *